United States Patent [19]

Maas et al.

[11] Patent Number: 4,545,110

[45] Date of Patent: Oct. 8, 1985

[54] METHOD OF MANUFACTURING AN INSULATED GATE FIELD EFFECT DEVICE

[75] Inventors: Henricus G. R. Maas; Francois M. Klaassen; Johannes A. Appels, all of Eindhoven, Netherlands

[73] Assignee: U.S. Philips Corporation, New York, N.Y.

[21] Appl. No.: 648,603

[22] Filed: Sep. 7, 1984

Related U.S. Application Data

[63] Continuation of Ser. No. 447,843, Dec. 8, 1982, abandoned.

[30] Foreign Application Priority Data

Jul. 5, 1982 [NL] Netherlands .......... 8202686

[51] Int. Cl.⁴ .......... H01L 21/263
[52] U.S. Cl. .......... 29/571; 29/576 B; 29/578; 148/187
[58] Field of Search .......... 29/571, 576 B, 578; 148/187

[56] References Cited

U.S. PATENT DOCUMENTS

| | | | |
|---|---|---|---|
| 4,109,371 | 8/1978 | Shibata et al. | 29/571 |
| 4,173,818 | 11/1979 | Bassous et al. | 29/571 |
| 4,306,915 | 12/1981 | Shiba | 29/571 X |
| 4,343,657 | 8/1982 | Ito et al. | 148/187 X |
| 4,419,809 | 12/1983 | Riseman et al. | 29/571 |
| 4,420,872 | 12/1983 | de Zaldivar | 29/578 X |

*Primary Examiner*—George T. Ozaki
*Attorney, Agent, or Firm*—Paul R. Miller

[57] ABSTRACT

A method of manufacturing a field effect device is set forth where the source and drain zones have extensions of an accurately and reproducibly determined length adjoining the gate electrode. According to the present invention, an oxygen-preventing insulating layer is formed on a first silicon layer forming the gate electrode, and a second silicon layer is provided on the oxygen-preventing layer. A part of the second silicon layer is removed and the edges substantially coincide with the edges of the gate electrode to be formed. The edges of the remaining part of the second silicon layer are oxidized. Through successive maskless selective etching steps, the first silicon layer is exposed and etched away at the area of the oxidized etched portions. The extensions of the source and drain zones are implanted through the openings thus obtained.

16 Claims, 27 Drawing Figures

METHOD OF MANUFACTURING AN INSULATED GATE FIELD EFFECT DEVICE

This is a continuation of application Ser. No. 447,843 filed Dec. 8, 1982 now abandoned.

The invention relates to a method of manufacturing an insulated gate field effect device, in which on a surface of a semiconductor region of a first conductivity type at least at the area of the gate electrode to be formed there is provided an electrically insulating layer and thereon a first silicon layer, whereupon a gate electrode is formed from the first silicon layer by etching and on either side of the electrode extensions of source and drain zones of the second opposite conductivity type are provided by implantation of ions at such an energy that at the area of the gate electrode the ions do not penetrate into the semiconductor region, and that highly doped contact portions of the source and drain zones are formed at a distance from the gate electrode determined in a self-aligning manner.

The invention further relates to a field effect device manufactured by the method.

A method of the kind described above is known from the "Proceedings of the International Electronic Device Meeting" (IEDM) 1981, Paper 28.3 of Ogura et al, "Elimination of hot electron gate currents by the lightly doped drain-source structure", p. 651-654.

In field effect devices, such as, for example, an insulated gate field effect transistor (IGFET), it is desirable in certain cases that at least the drain zone in the immediate proximity of the gate electrode has a lower-doped extension, while the remaining part of the drain zone is constituted by a more highly doped contact portion, which is located at a small distance from the gate electrode. As a result, the breakdown voltage of the drain/pn-junction is increased and injection of hot charge carriers into the gate dielectric resulting in a degradation of the characteristics is prevented. This is of particular importance in field effect devices having a very small channel length, in which the influence on the characteristics of injection of hot charge carriers into the gate dielectric is relatively greatest.

However, in particular at very small dimensions, technological difficulties are involved in providing such extensions of the source and/or drain zones. Extensions of source and drain zones having a dimension of 1 $\mu$m or less between the gate electrode and the highly doped contact portion cannot or can hardly be formed in a reproducible manner with the aid of masking techniques, due to the alignment tolerance then required.

In the publication in IEDM 1981, a method is described of manufacturing an insulated gate field effect transistor in which, after the gate electrode consisting of polycrystalline silicon has been defined, low-doped source and drain zone extensions are implanted while using the gate electrode as a mask. Subsequently, a layer of silicon oxide is pyrolytically deposited on the entire surface, inclusive of the gate electrode. By means of plasma etching (RIE), this silicon oxide is then removed everywhere except on the edges of the gate electrode. While using the silicon oxide parts left behind on the edge of the gate electrode as a mask, the more highly doped contact portions of the source and drain zones are then provided down to a larger depth than the low-doped extensions so that the ultimate dimension of these low-doped parts from the source to the drain zone is determined by the width of the silicon oxide parts.

This known method has several important disadvantages. For example, the width of the silicon oxide parts left behind on the edge of the gate electrode is poorly reproducible. Further, the plasma etching treatment of the pyrolytically deposited oxide is not selective with respect to the underlying gate oxide so that the etching process cannot be controlled easily.

The invention has for its object to provide a method in which source and drain zone extensions having accurately reproducible very small dimensions can be obtained in a self-aligning manner in the immediate proximity of the gate electrode. The method can also provide a so-called buried gate electrode structure having a homogeneous gate dielectric of, for example, solely silicon oxide.

The invention is based on the recognition of the fact that this can be achieved by the use of an auxilliary silicon layer in combination with an oxidation process.

According to the invention, a method of the kind described in the preamble is characterized in that on the first silicon layer there is provided at least a first oxidation-preventing layer and thereon a second silicon layer, in that then a part of the second silicon layer is removed with the edges of the remaining part of this layer substantially coinciding with the edges of the gate electrode to be provided, in that subsequently at least the edge portions of the second silicon layer are thermally oxidized in a first oxidation step, whereupon the uncovered parts of the first oxidation-preventing layer are etched away selectively, in that then the oxidized edge portions are etched away and the exposed silicon surface is thermally oxidized in a second oxidation step, in that subsequently the exposed parts of the first oxidation-preventing layer are etched away and then the parts of the first silicon layer thus exposed are etched away at least down to the insulating layer, in that through the openings in the first silicon layer thus obtained, the extensions of the source and drain zones are implanted, then the exposed oxide layers are etched away and in that during a third oxidation step the silicon thus exposed is provided with a thermal oxide layer.

By the use of the method according to the invention, source and drain zone extensions with accurately defined and controllable dimensions are obtained. In this connection, it is of great importance that the step of etching the silicon layer is very selective with respect to the underlying gate dielectric (the insulating layer) and as a result can be very accurately controlled.

Alternatively, as has already been stated, a buried gate electrode structure can be obtained by the use of the method according to the invention with the gate dielectric then consisting of an insulating layer of homogeneous composition, for example, of silicon oxide. This is in contrast with most of the known techniques for obtaining buried gate electrode structures, in which mostly the gate dielectric consists of juxtaposed layers of silicon oxide and silicon nitride, which may give rise to instabilities and etching problems.

According to a first preferred embodiment, the second silicon layer is removed at the area of the gate electrode to be formed. In this preferred embodiment, the highly doped parts of the source and drain zones can be formed by removing after the third oxidation step the remaining parts of at least the first oxidation-preventing layer and, if desired, also the underlying parts of the first silicon layer and by forming under these parts the highly doped contact portions of the source and drain zones, preferably by ion implantation, so as to join the source and drain zone extensions.

According to a second preferred embodiment, a part of the second silicon layer is removed while ensuring that the part at the area of the gate electrode to be formed remains. In this preferred embodiment, after the first oxidation-preventing layer has been etched away and before the oxidized edge portions are etched away, the highly doped contact portions of the source and drain zones are advantageously implanted through the first silicon layer into the semiconductor region of the first conductivity type.

The insulating layer may be provided over the entire surface, but is often preferably provided substantially only at the area of the gate electrode to be formed.

According to a further important preferred embodiment, the second silicon layer is coated with a second oxidation-preventing layer, in which case, before removing a part of the second silicon layer, the part of the second oxidation-preventing layer disposed thereon is removed. The first and the second oxidation-preventing layers both preferably consist of the same material, which advantageously comprises silicon nitride.

The invention will now be described more fully with reference to a few embodiments and the drawing, in which:

FIGS. 8 to 11 show a modification of the method shown in FIGS. 1 to 7, FIGS. 12 to 17 diagrammatically show in cross-section another preferred embodiment of the method according to the invention in successive stages of manufacture.

The figures are purely schematic and not drawn to scale. This applies in particular to the dimensions in the direction of thickness. Corresponding parts are generally designated by the same reference numerals. Semiconductor regions of the same conductivity type are generally cross-hatched in the same direction.

Figure 1:
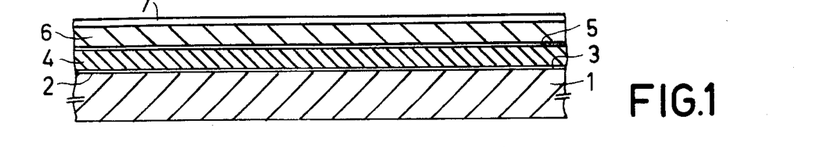
FIGS. 1 to 7 diagrammatically show in cross-section successive stages in the manufacture of a first preferred embodiment of the method according to the invention.
Figure 2:
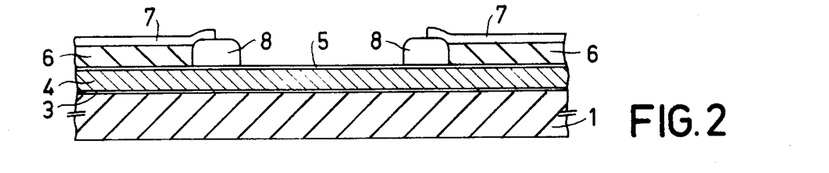

FIGS. 1 to 7 diagrammatically show in cross-section successive stages in the manufacture of a first preferred embodiment of the method according to the invention. As is indicated in FIG. 1, there is first provided on a surface 2 of a semiconductor region 1 of a first conductivity type, in this example a p-type silicon region having a resistivity of approximately 10 $\omega$cm, for example, by thermal oxidation an electrically insulating layer 3 of silicon oxide, on which a first silicon layer 4 is deposited. In this example, the silicon layer 4 is deposited in the form of a strongly n-type doped polycrystalline silicon layer from the gaseous phase by thermal decomposition of a silicon compound, such as $SiH_4$, with the addition of a dopant, for example, phosphorus in the form of $PH_3$, according to generally known techniques. The thickness of the layer 3 is 0.05 $\mu$m and that of the layer 4 is 0.5 $\mu$m. As will be described below in greater detail, a gate electrode (FIG. 5) will be formed from the first silicon layer 4 by etching, while on either side of this electrode, there are formed by ion implantation n-type source and drain zone extensions 12 and 13 and highly doped n-type contact portions (15,16) of the source and drain zones, at a distance from the gate electrode determined in a self-aligning manner (see FIG. 7).

According to the invention, for this purpose a first oxidation-preventing layer 5 is provided on the first silicon layer 4 and thereon a second silicon layer 6. In this example, moreover a second oxidation-preventing layer 7 is provided thereon, see FIG. 1. In this example, the oxidation-preventing layers 5 and 7 both consist of silicon nitride, while the layer 6 may be a doped or an undoped polycrystalline silicon layer and may be provided in the same manner as the layer 4. The thickness of the layers 5, 6 and 7 are 0.1 $\mu$m, 0.3 $\mu$m and 0.2 $\mu$m, respectively. In this example, all the layers mentioned above are provided over the entire surface.

Subsequently (see FIG. 2), a part of the second oxidation-preventing layer 7 and the underlying part of the second silicon layer 6 are removed by etching. The edges of the remaining parts of the layers 6 and 7 then substantially coincide with the edges of the gate electrode to be formed afterwards. Advantageously, hot phosphoric acid is used for selectively etching silicon nitride, and a solution of 20% by weight of KOH in water is used for selectively etching polycrystalline silicon.

Figure 3:
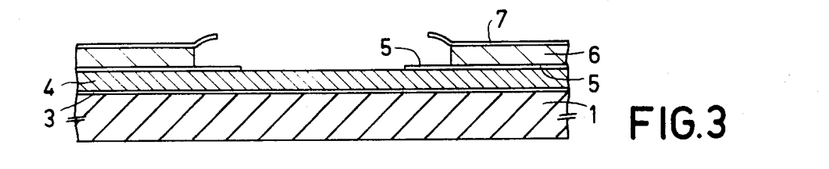
Figure 4:
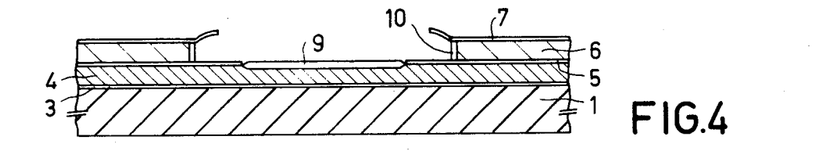

The edge portions of the second silicon layer 6 are then thermally oxidized in a first oxidation step at 1000° C. for 3 hours in water vapour, which results (see FIG. 2) in that oxidized edge portions 8 having a width of approximately 0.7 $\mu$m are obtained. Subsequently, the uncovered parts of the first silicon nitride layer 5 are etched away completely and the second silicon nitride layer 7 is etched away only over part of its thickness (due to its larger thickness) without the use of an etching mask, whereupon the oxidized edge portions 8 are etched away. Thus, the situation shown in FIG. 3 is obtained.

During a second oxidation step at 850° C. for 90 minutes in water vapour, the silicon surface now exposed is thermally oxidized. The oxide layer 9 is then formed, while also the edge portions of the silicon layer 6 are lightly oxidized, which results in that oxide layers 10 are obtained, see FIG. 4.

Subsequently, the second silicon nitride layer 7 and the exposed parts of the first silicon nitride layer 5 are etched away completely, whereupon the silicon layer 6 is etched away completely and the exposed parts of the first silicon layer 4 are etched away down to the oxide layer 3, for example, in a $CCl_4$-chlorine plasma at a frequency of, for example, 13.56 MHz, a pressure of 9.3 Pa and a power of 300 W. The gate electrode 4A and the openings 11 are then obtained, see FIG. 5.

Figure 5:
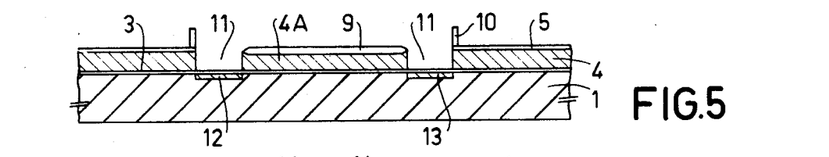

Through the openings 11, the low-doped extensions 12 and 13 of the source and drain zones are now formed by implantation of phosphorus ions, see FIG. 5. The energy of the implanted ions is such that at the area of the gate electrode 4A and also of the layers 4 and 5 these ions do not penetrate into the semiconductor region 1. In this example, the energy mounted to 100 keV, the dose was $10^{13}$ ions/cm$^2$ and the thickness of the regions 12 and 13 was 0.25 $\mu$m, while the implantation was carried out through the gate oxide layer 3. However, if desired, the oxide layer 3 may be removed inside the openings 11 before the implantation is carried out.

Figure 6:
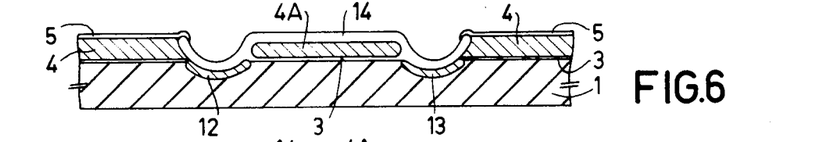

All the exposed oxide layers are then removed by etching, whereupon during a third oxidation step at 850° C. for 300 min. in water vapour the silicon thus exposed is provided with a thermal oxide layer 14, see FIG. 6.

In this example, the highly doped contact portions 15 and 16 (see FIG. 7) of the source and drain zones are provided by first removing the layers 4 and 5 and, if desired, also the layer 3 by etching, and then implanting the regions 15 and 16 with phosphorus ions, the oxide layer 14 masking against this implantation, for example, at an energy of 25 keV and a dose of $5 \times 10^{15}$ ions/cm$^2$. If desired, the regions 15 and 16 may alternatively be obtained by diffusion.

The regions 15 and 16 and the gate electrode 4A may be contacted in the usual manner by etching contact windows and by metallization. This is not indicated further in the figures. The source and drain zone portions 15 and 16 may join in an integrated circuit conducting semiconductor tracks and in this case need not be contacted through contact windows. The gate electrode may form part of a pattern of polycrystalline silicon interconnections.

The distance of the highly doped contact portions 15 and 16 from the gate electrode 4A, in other words the dimension, viewed from the source to the drain zone, of the lower doped extensions 12 and 13 in the method according to the invention is therefore fully determined in a self-aligning manner, it being fixed by the edge portions 8 oxidized earlier. The dimension of the parts 12 and 13 may be very small ($<1$ μm). Furthermore, a buried gate electrode 4A, which is entirely surrounded by insulating material, is obtained with a gate dielectric 3, which wholly consists of silicon oxide.

A modification of this preferred embodiment is now described with reference to FIGS. 8 to 11, in which the reference numerals correspond to those of FIGS. 1 to 7. FIG. 8 corresponds to the stage of FIG. 4, except that the insulating layer 3, the gate dielectric, was provided here practically only at the area of the gate electrode to be formed. Further, the layers 3,4,5,6 and 7 as well as the region 1 consist of the same materials as in the preceding example, while the layers also have the same thicknesses.

Figure 9:
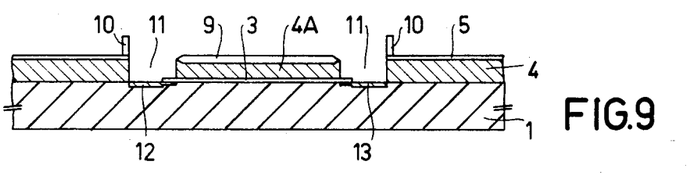

FIG. 9 corresponds to the stage of FIG. 5. Also in this case, the openings 11 were etched down to the insulating layer and the phosphorus implantation for the formation of the low-doped source and drain zone extensions 12 and 13 was carried out through the insulating layer 3, as far as this layer was present within the openings 11.

Figure 7:
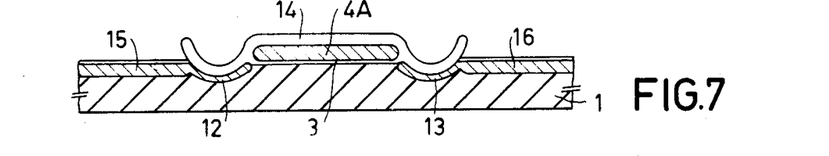
Figure 8:
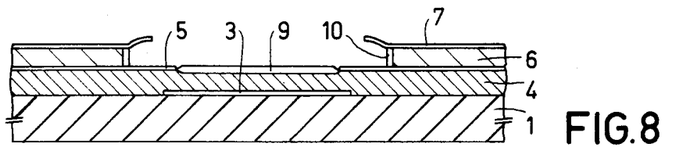
Figure 10:
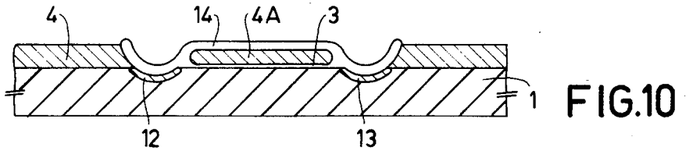
Figure 11:
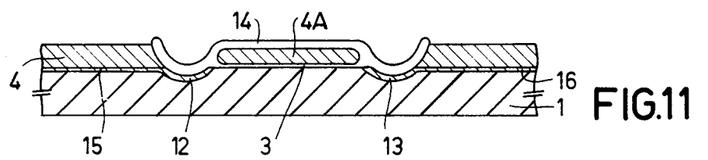

The stages of FIGS. 10 and 11 correspond to those of FIGS. 6 and 7. In this case, however, the highly doped source and drain contact regions 15 and 16 were provided in a somewhat different manner, i.e. in and through the first silicon layer 4. The parts of the layer 4 thus strongly n-type doped likewise form part of the highly doped contact portions of the source and drain zones.

In the two preceding examples, the second oxidation-preventing silicon nitride layer 7 and the underlying part of the second silicon layer 6 were removed at the area of the gate electrode 4A to be formed. The following preferred embodiment illustrated with reference to FIGS. 12 to 17 is complementary thereto.

Figure 12:
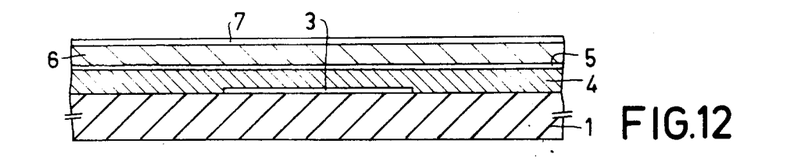

As in the preceding examples, in FIG. 12, there are provided on a semiconductor region 1 of p-type silicon, an insulating layer 3, the gate dielectric, and thereon in order of succession a first silicon layer 4, a first oxidation-preventing layer 5, a second silicon layer 6 and a second oxidation-preventing layer 7. The layers may be of the same composition, thickness and doping as in the preceding examples. The insulating layer 3 is provided, as in the example shown in FIGS. 8 to 11, substantially only at the area of the gate electrode to be formed.

Figure 13:
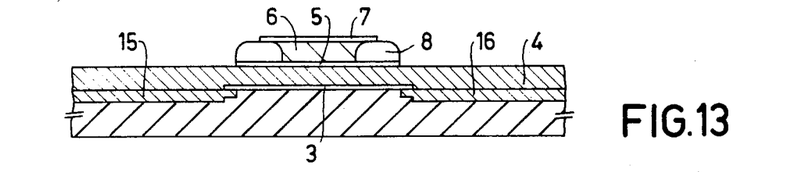

In contrast with the preceding examples, however, the layers 7 and 6 are now not removed at the area of the gate electrode to be formed, but they are just maintained at the area of the gate electrode. The edges of the remaining parts of the layers 6 and 7 also in this case substantially coincide with those of the gate electrode to be formed afterwards. Subsequently, the edge portions 8 of the layer 6 are oxidized whereupon the uncovered parts of the silicon nitride layer 5 are etched away completely, the silicon nitride layer 7 being removed only in part due to its larger thickness. The highly doped contact portions 15 and 16 of the source and drain zones are then implanted through the first silicon layer 4 (and the layer 3) by means of an implantation of phosphorus ions, which are masked by the layers 5,6,8 and 7. Thus, the structure of FIG. 13 is obtained.

Figure 14:
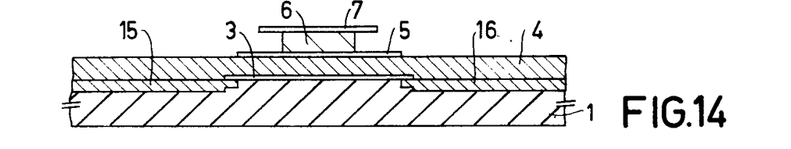
Figure 15:
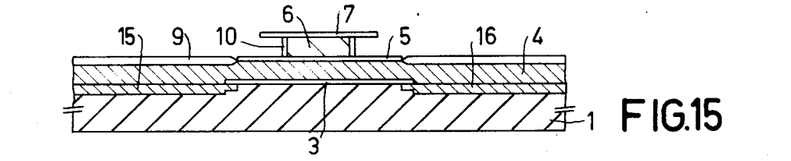
Figure 16:
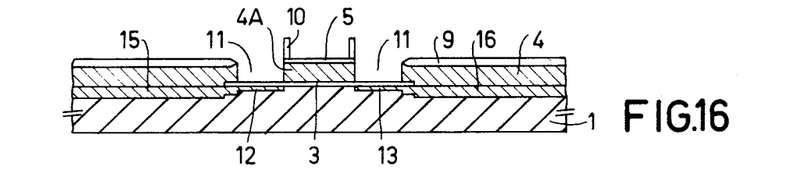
Figure 17:
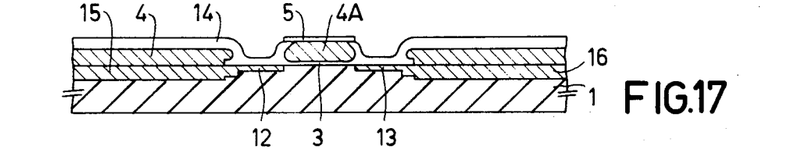

After selectively etching away the oxidized edge portions 8, the structure of FIG. 14 is obtained. During a second oxidation step, the oxide layers 9 and 10 are then formed, see FIG. 15. After removing by etching first the silicon nitride layers 5 and 7 are then the second silicon layer 6 and the exposed parts of the first silicon layer 4 down to the insulating layer 3, the openings 11 are obtained (see FIG. 16). By implantation of phosphorus ions, the low-doped source and drain zone extensions 12 and 13 are then formed. After the oxide layers 3,9 and 10 have been etched away selectively, a third oxidation step is carried out so as to produce the oxide layer 14. In this case, the gate electrode 4A is not entirely surrounded by oxide, but is covered on the upper side by the silicon nitride layer 5. However, if this layer 5 is etched away before the oxide layer 14 is formed, a buried gate electrode structure analogous to that of FIGS. 7 and 11 is obtained.

Again the source and drain zones may be contacted in the usual manner by etching contact windows and metallizing.

Figure 18:
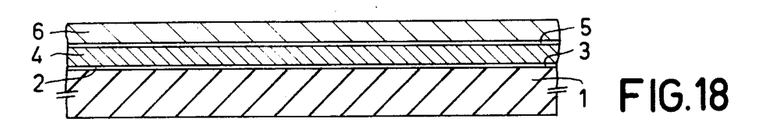
FIGS. 18 to 22 show a further modification of the method shown in FIGS. 1 to 7, and FIGS. 23 to 27 show a modification of the method shown in FIGS. 12 to 17.
Figure 19:
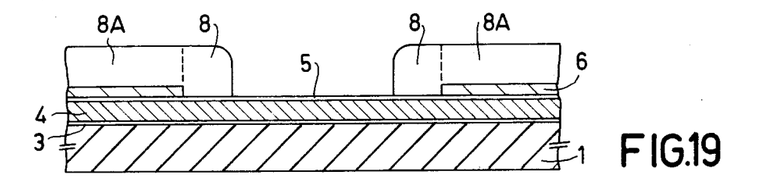
Figure 20:
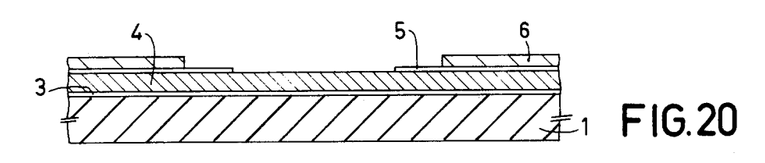
Figure 21:
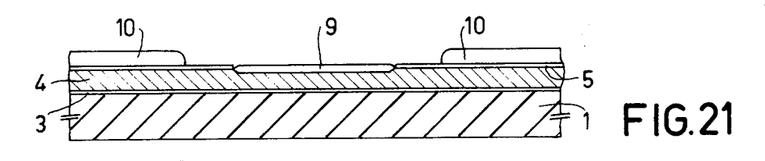
Figure 22:
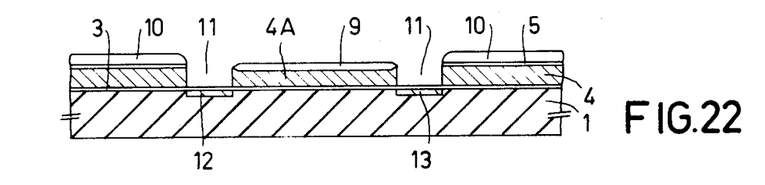
Figure 23:
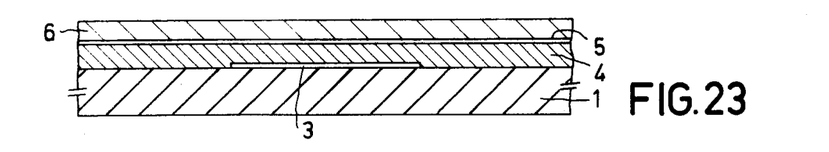
Figure 24:
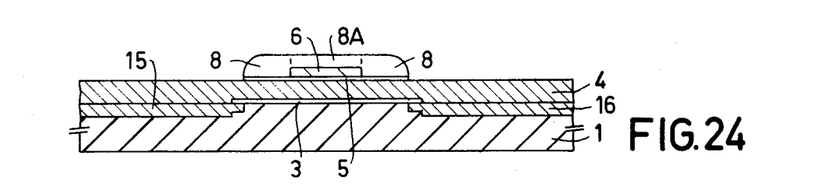
Figure 25:
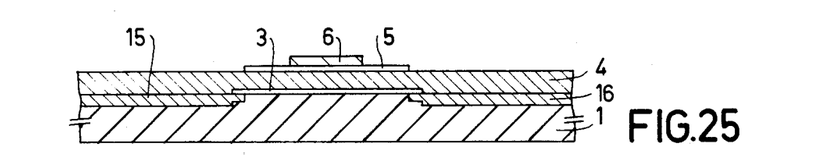
Figure 26:
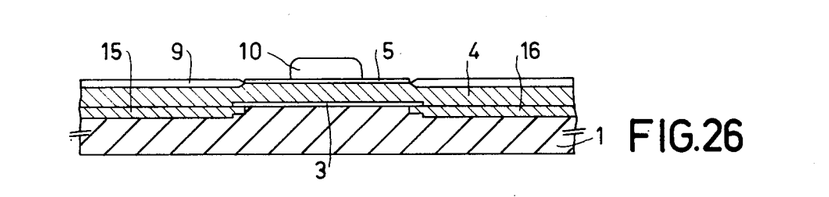
Figure 27:
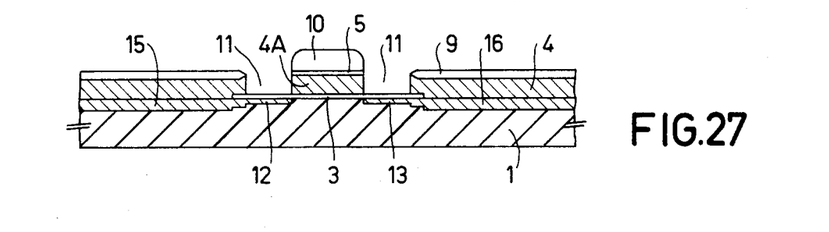

The presence of a second oxidation-preventing layer 7 is not always required. Thus, the method shown in FIGS. 1 to 7 may be carried out in the absence of layer 7. For further explanation see FIGS. 18 to 22, which correspond to the respective FIGS. 1 to 5, in case the layer 7 is omitted (see FIG. 18). In this case (see FIG. 19), during the first oxidation step the edge portions of the second silicon layer 6 are converted completely into oxide 8, the remaining parts of the layer 6 being converted into oxide 8A over only part of their thickness. If the remaining part of the silicon layer 6 is sufficiently thin, (see FIG. 20) the part of the silicon layer 6 left after etching away the oxide (8,8A) is converted completely into oxide 10 during the second oxidation step (see FIG. 21). After the openings 11 have been etched (see FIG. 22), the method is terminated in the manner shown in FIGS. 6 and 7. In an analogous manner, the method shown in FIGS. 12 to 17 may be carried out in the absence of layer 7. See FIGS. 23 to 27, which correspond to the respective FIGS. 12 to 17 in the absence of layer 7. Here too, during the first oxidation step (see FIG. 24) a part 8A of the remaining part of the layer 6 outside the edge portions 8 is likewise converted into oxide. If the remaining part of layer 6 is sufficiently thin (see FIG. 25), it is oxidized completely during the second oxidation step (FIG. 26). After the openings 11 have been etched (see FIG. 27), the method is terminated by the steps shown in FIGS. 16 and 17.

When a second oxidation-preventing layer 7 is not used, the first oxidation step must be accurately controlled since outside the edge portions 8 the silicon layer 6 should be oxidized over only part of its thickness. Therefore, the use of a second oxidation-preventing layer 7 may sometimes be advantageous.

If the second silicon layer 6 is sufficiently thin, for example, thinner than 50 nm, in the embodiment of FIGS. 1 to 7 the silicon nitride layer 7 may be as thick as or thinner than the silicon nitride layer 5. The layer 7 is then etched away completely in the stage of FIG. 3, while during the second oxidation step (FIG. 4) the thin silicon layer 6 is oxidized completely. The method may be terminated by the same steps as in FIGS. 5 to 7. The same modification may of course be applied to the example of FIGS. 12 to 17.

It should be appreciated that many further modifications are possible within the scope of the invention. For example, the semiconductor region 1 may consist of another semiconductor material than silicon. Furthermore, the oxidation-preventing layers 5 and 7 may instead of silicon nitride comprise silicon oxynitride or another oxidation-preventing material. The layers 5 and 6 need not even consist of the same material (although this would result in an increase of the number of etching steps). The thickness of the layers 4,5,6 and 7 may be suitably chosen for each application by those skilled in the art. Alternatively, if desired, the gate dielectric 3 may consist of another material than silicon oxide.

When an additional mask is used, another implantation dose may be utilized for the formation of the region 12 than for the formation of the region 13. This is of importance when, for example, only the drain zone, but not the source zone is to be provided with a comparatively lowdoped extension 13. The extension 12 may then be chosen to be more highly doped and/or thicker than the region 13. The use of an additional mask, however, is only possible with somewhat larger dimensions.

Although in the given embodiments, n-channel MOS transistors of the enhancement type were realized, p-channel transistors may be manufactured by reversal of all conductivity types and by implantation of acceptor ions, for example, boron ions. Furthermore, instead of enhancement transistors, depletion transistors may be manufactured by implanting or diffusing an n- or a p-type channel at the area of the gate electrode to be formed before the layer 3 is provided. Instead of one gate electrode, a plurality of gate electrodes may be realized for the formation of, for example, a tetrode-MOST or a charge-coupled device (CCD).

What is claimed is:

1. In a method of manufacturing an insulated gate field effect device the steps comprising
    providing a semiconductor region of a first conductivity type,
    providing an electrically insulating layer on a surface of said semiconductor region at least at an area where a gate electrode is to be formed,
    forming a first silicon layer over at least said electrically insulating layer,
    providing a first oxidation preventing layer on said first silicon layer,
    providing a second silicon layer on said first oxidation preventing layer,
    removing at least a portion of said second silicon layer to form edges at remaining parts of said second silicon layer, said edges substantially coinciding with edges of said gate electrode to be formed,
    thermally oxidizing said edge portions of said second silicon layer to form oxidized edge portions,
    selectively etching away exposed portions of said first oxidation preventing layer,
    etching away said oxidized edge portions with previously covered portions of said first oxidation preventing layer remaining on said first silicon layer,
    thermally oxidizing exposed portions of said first silicon layer,
    etching away said remaining exposed portions of said first oxidation preventing layer and said first silicon layer thereunder at least down to said electrically insulating layer to form openings,
    implanting ions into said semiconductor region at a first doping concentration through said openings in said first silicon layer to form source and drain zone extensions of a second conductivity type at opposite sides of said gate electrode to be formed,
    etching away all remaining exposed oxide portions, and
    thermally oxidizing thus exposed surfaces of said first silicon layer to form a thermal oxide layer covering said gate electrode formed of said first silicon layer between said source and drain extensions.

2. A method according to claim 1, wherein ions are implanted into said semiconductor region at a second higher doping concentration at opposite sides of said source and drain extensions from said gate electrode, said higher doping forming source and drain regions joining said source and drain extensions.

3. A method according to claim 2, wherein upon thermally oxidizing said edge portions of said second silicon layer, said edge portions are completely oxidized and remaining portions of said second silicon layer are oxidized only over a part of their thickness, and wherein upon thermally oxidizing said exposed portions of said first silicon layer, said remaining portions of said second silicon layer are completely oxidized.

4. A method according to claim 2, wherein after providing said second silicon layer on said first oxidation preventing layer, a second oxidation preventing layer is provided on said second silicon layer, and wherein before portions of said second silicon layer are removed, said overlying second oxidation preventing layer is removed.

5. A method according to claim 4, wherein said two oxidation preventing layers are the same material.

6. A method according to claim 5 wherein said second oxidation prevention layer has a greater thickness than said first oxidation preventing layer, and wherein after thermally oxidizing said edge portions, said exposed portions of said first oxidation preventing layer are completely removed and said second oxidation preventing layer is only partially removed.

7. A method according to claim 4, wherein at least one of said first oxidation preventing layer and said second oxidation preventing layer comprise silicon nitride.

8. A method according to claim 2, wherein said electrically insulating layer is only provided at said area where said gate electrode is to be formed.

9. A method according to claim 2, wherein said second silicon layer is removed at said area where said gate electrode is to be formed.

10. A method according to claim 9, wherein after thermally oxidizing said thus exposed surfaces of said first silicon layer, at least remaining portions of said first oxidation preventing layer are removed, and said higher doped source and drain regions are formed thereunder.

11. A method according to claim 2, wherein upon removing said portion of said second silicon layer to form said edges, said second silicon layer remains over said area where said gate electrode is to be formed.

12. A method according to claim 11, wherein after said exposed portions of said first oxidation preventing layer have been etched away, and before etching away said oxidized edge portions, said higher doped source and drain regions are provided in said semiconductor region through said first silicon layer to form highly doped contact portions.

13. A method according to claim 1, wherein said first oxidation preventing layer comprises silicon nitride.

14. A method according to claim 1, wherein said source and drain extensions have different doping concentrations.

15. A method according to claim 1, wherein said electrically insulating layer is silicon oxide.

16. A method according to claim 1, wherein said semiconductor region is silicon.

* * * * *